United States Patent
Shimizu

(10) Patent No.: US 10,148,062 B2
(45) Date of Patent: Dec. 4, 2018

(54) LASER LIGHT SOURCE DEVICE

(71) Applicant: USHIO DENKI KABUSHIKI KAISHA, Tokyo (JP)

(72) Inventor: Akihiro Shimizu, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/766,699

(22) PCT Filed: Oct. 4, 2016

(86) PCT No.: PCT/JP2016/079526
§ 371 (c)(1),
(2) Date: Apr. 6, 2018

(87) PCT Pub. No.: WO2017/061436
PCT Pub. Date: Apr. 13, 2017

(65) Prior Publication Data
US 2018/0301867 A1 Oct. 18, 2018

(30) Foreign Application Priority Data
Oct. 7, 2015 (JP) ................................. 2015-199686

(51) Int. Cl.
*H01S 5/024* (2006.01)
(52) U.S. Cl.
CPC ...... *H01S 5/02415* (2013.01); *H01S 5/02476* (2013.01)
(58) Field of Classification Search
CPC .......................... H01S 5/02415; H01S 5/02476
See application file for complete search history.

(56) References Cited

U.S. PATENT DOCUMENTS

| | | | |
|---|---|---|---|
| 5,603,570 A | 2/1997 | Shimizu | |
| 6,229,832 B1* | 5/2001 | Baba | H01S 5/06808 372/29.011 |
| 2017/0047709 A1* | 2/2017 | Hodgkinson | H01S 5/02415 |

FOREIGN PATENT DOCUMENTS

| | | |
|---|---|---|
| JP | H07-131111 A | 5/1995 |
| JP | H11-126939 A | 5/1999 |

(Continued)

OTHER PUBLICATIONS

Notification of Transmittal of Translation of the International Preliminary Report on Patentability and Translation of Written Opinion of the International Searching Authority; PCT/JP2016/079526; dated Apr. 19, 2018.

(Continued)

*Primary Examiner* — Dung Nguyen
(74) *Attorney, Agent, or Firm* — Studebaker & Brackett PC

(57) ABSTRACT

A laser light source device has a semiconductor laser element, a heat transfer portion having thermal conductivity and connected to the semiconductor laser element, a cooler connected to the heat transfer portion on a side different from the semiconductor laser element, a control object temperature measurement section that measures a control object temperature as the temperature of the heat transfer portion or the cooler, an environmental temperature measurement section that measures an environmental temperature of the laser light source device, and a controller that controls the cooler. The controller is configured to control the cooler such that the control object temperature approaches a predetermined target temperature set according to the environmental temperature. The target temperature set when the environmental temperature is lower than a specific temperature is lower than the target temperature set when the (Continued)

environmental temperature is higher than the specific temperature.

17 Claims, 7 Drawing Sheets

(56) References Cited

FOREIGN PATENT DOCUMENTS

| JP | 2001-168446 A | 6/2001 |
| JP | 2013-195018 A | 9/2013 |
| JP | 2013-225557 A | 10/2013 |

OTHER PUBLICATIONS

International Search Report issued in PCT/JP2016/079526; dated Nov. 15, 2016.

* cited by examiner

LASER LIGHT SOURCE DEVICE

TECHNICAL FIELD

The present invention relates to a laser light source device.

BACKGROUND ART

Since a semiconductor laser element generates heat during operation, the temperature of the element rises. Here, it is known that the lifetime of the semiconductor laser element decreases as the temperature rises. Accordingly, in order to achieve a long lifetime of the semiconductor laser element, it is required that the temperature of the element is not more than a fixed required temperature. From such a viewpoint, in general, a laser light source device including a semiconductor laser element is provided with a cooler for cooling the semiconductor laser element. In the following description, the "temperature of the semiconductor laser element" refers to the temperature during operation of the semiconductor laser element.

Patent Document 1 discloses a laser light source device including a Peltier element as an example of the above-described cooler. The laser light source device includes a measurer for measuring the temperature of the semiconductor laser element. A current value to be supplied to the Peltier element is controlled so that the temperature of the semiconductor laser element measured by the measurer is stabilized within not more than a fixed required temperature range. Specifically, in the laser light source device of Patent Document 1, control is performed to increase the current value to be supplied to the Peltier element as the measured temperature of the semiconductor laser element is higher.

PRIOR ART DOCUMENT

Patent Documents

Patent Document 1: JP-A-2001-168446

SUMMARY OF THE INVENTION

Problems to be Solved by the Invention

However, as a result of intensive studies, the present inventor has found out that in the technique described in Patent Document 1, there occurs such an event that the temperature of the semiconductor laser element exceeds the required temperature. For this reason, the present inventor considers as follows.

In many cases, a semiconductor laser element and a cooler are connected via a medium such as a heat sink, for example. Thus, the medium is interposed on a heat transfer path from the semiconductor laser element as a heat source to the cooler as a heat absorption destination, so that it takes time until heat generated from the semiconductor laser element is conducted to the cooler. There will be considered a case where under such a condition, the temperature of the semiconductor laser element is measured at a certain timing and the cooler is operated such that the temperature is not more than the above-described required temperature.

For example, it is assumed that the temperature of the semiconductor laser element is high at a certain timing. At this time, for example, control for increasing a driving force of a Peltier element is performed in order to enhance the heat absorbing action of the cooler. However, even if the control for increasing the driving force of the Peltier element is performed, since the heat absorbing action of the cooler is merely enhanced, it takes a certain amount of time until the heat emitted from the semiconductor laser element is actually absorbed by the cooler. That is, a time lag occurs until the temperature of the semiconductor laser element sufficiently decreases after the cooler has increased the cooling capability. As a result, during this time lag, the temperature of the semiconductor laser element exceeds the required temperature.

In consideration of the above, the inventor of the present invention has conducted intensive studies on a technique for stabilizing the temperature of the semiconductor laser element at not more than a fixed required temperature by a method different from the conventional method. As a result, the present inventor has found that further problems as described below arise.

Temperature in an environment where a laser light source device is installed (hereinafter referred to as the environmental temperature) varies depending on climate, air conditioning, and the like. For example, when the laser light source device is installed outdoors, the environmental temperature is affected by changes in temperature in a day and changes in seasons. Specifically, the environmental temperature tends to be high in a time zone during the day and low in the nighttime hours. Similarly, the environmental temperature tends to be high in summer and low in winter. When the laser light source device is installed indoors, the environmental temperature is affected by, for example, air conditioning equipment. As described above, the environmental temperature of the laser light source device is not necessarily stabilized at a fixed temperature, and changes with the lapse of time.

As a result of intensive studies, the present inventor has found out that there are cases where the temperature of the semiconductor laser element exceeds the above-described required temperature due to the influence of the environmental temperature of the laser light source device, and it falls below the above-described required temperature. Specifically, it has been confirmed that when the laser light source device operates at a relatively high environmental temperature, the cooler executes cooling operation, so that the temperature of the semiconductor laser element is stabilized at not more than the above-described required temperature. On the other hand, it has been confirmed that when the laser light source device operates at a relatively low environmental temperature, the cooler does not execute the cooling operation, so that the temperature of the semiconductor laser element exceeds the above-described required temperature.

As described above, the environmental temperature of the laser light source device is not necessarily stabilized at a fixed temperature. Thus, even when the environmental temperature of the laser light source device changes, it is required that the temperature of the semiconductor laser element is not more than the above-described required temperature.

It is an object of the present invention to provide a technique capable of suppressing shortening of the lifetime of a semiconductor laser element by keeping the temperature of the semiconductor laser element at not more than a fixed required temperature even if the environmental temperature changes.

Means for Solving the Problem

A laser light source device of the present invention has a semiconductor laser element, a heat transfer portion having thermal conductivity and connected to the semiconductor laser element, a cooler connected to the heat transfer portion on a side different from the semiconductor laser element, a control object temperature measurement section that measures a control object temperature as the temperature of the heat transfer portion or the cooler, an environmental temperature measurement section that measures an environmental temperature of the laser light source device, and a controller that controls the cooler. In this laser light source device, the controller is configured to control the cooler such that the control object temperature approaches a predetermined target temperature set according to the environmental temperature, and the target temperature set when the environmental temperature is lower than a specific temperature is lower than the target temperature set when the environmental temperature is higher than the specific temperature.

According to the above configuration, the temperature of the heat transfer portion or the cooler is measured, and the temperature is to be controlled. That is, the temperature at a place closer to the cooler than the semiconductor laser element is to be controlled. Consequently, an influence of a medium interposed between the semiconductor laser element and the cooler can be suppressed. Further, according to the above configuration, when the environmental temperature is lower than the specific temperature, the target temperature is set to a relatively low temperature. Thus, it is possible to suppress occurrence of a situation that the control object temperature always falls below the target temperature and the cooler does not operate. That is, even when the environmental temperature is relatively low, it is possible to operate the cooler. Therefore, according to the above configuration, it is possible to suppress shortening of the lifetime of the semiconductor laser element because the temperature of the semiconductor laser element can be kept at not more than a fixed required temperature even if the environmental temperature changes.

In the above configuration, the control object temperature in a case where the environmental temperature is lower than the specific temperature and the cooler does not operate may be measured in advance, and when the environmental temperature is lower than the specific temperature, the target temperature may be set to not more than the control object temperature measured in advance.

According to the above configuration, even when the environmental temperature is lower than the specific temperature, the control object temperature is not less than the target temperature. As a result, it is possible to suppress that the control object temperature falls below the target temperature. That is, it is possible to operate the cooler even when the environmental temperature is lower than the specific temperature, keep the temperature of the semiconductor laser element at not more than a fixed required temperature, and suppress shortening of the lifetime of the semiconductor laser element.

Further, in the above configuration, the cooler may be a Peltier element having a heat absorbing portion that absorbs heat from the heat transfer portion, and the control object temperature measurement section may measure the temperature in the heat absorbing portion of the Peltier element.

According to the above configuration, in the case where the cooler is constituted by the Peltier element, the temperature in the heat absorbing portion of the Peltier element is measured, and the temperature is to be controlled. Consequently, the influence of the medium interposed between the semiconductor laser element and the cooler can be further suppressed.

Further, in the above configuration, when the environmental temperature is lower than the specific temperature, the target temperature may be set higher as the environmental temperature approaches the specific temperature.

There is a possibility that the higher the environmental temperature, the higher the control object temperature. Thus, when a fixed target temperature is set regardless of the environmental temperature, or when the target temperature is set lower as the environmental temperature becomes higher, as the environmental temperature rises, a temperature difference between the control object temperature and the target temperature rises. Thus, as the environmental temperature rises, power consumption of the cooler increases. On the other hand, according to the above configuration, as the environmental temperature approaches a specific temperature from a temperature lower than the specific temperature, the target temperature is set higher. Thus, even if the environmental temperature rises, it is possible to suppress an increase in difference between the control object temperature and the target temperature. Consequently, an increase in the power consumption of the cooler can be suppressed.

Further, in the above configuration, when the environmental temperature is not less than the specific temperature, the target temperature may be set to a fixed temperature.

According to the above configuration, when the environmental temperature is not less than the specific temperature, the target temperature is kept at a fixed temperature. This allows to keep the temperature of the semiconductor laser element at a fixed temperature even if the environmental temperature varies within not less than a specific temperature range.

Further, in the above configuration, the controller may have a storage that stores the target temperature corresponding to each of the environmental temperatures, a target temperature determination section that determines the target temperature, corresponding to the environmental temperature measured by the environmental temperature measurement section, from among the target temperatures stored in the storage, and a current value determination section that determines a current value to be supplied to the cooler based on a difference between the determined target temperature and the control object temperature measured by the control object temperature measurement section.

Effect of the Invention

According to the laser light source device of the present invention, shortening of the lifetime of the semiconductor laser element can be suppressed by keeping the temperature of the semiconductor laser element at not more than a fixed required temperature even if the environmental temperature changes.

MODE FOR CARRYING OUT THE INVENTION

Figure 1:
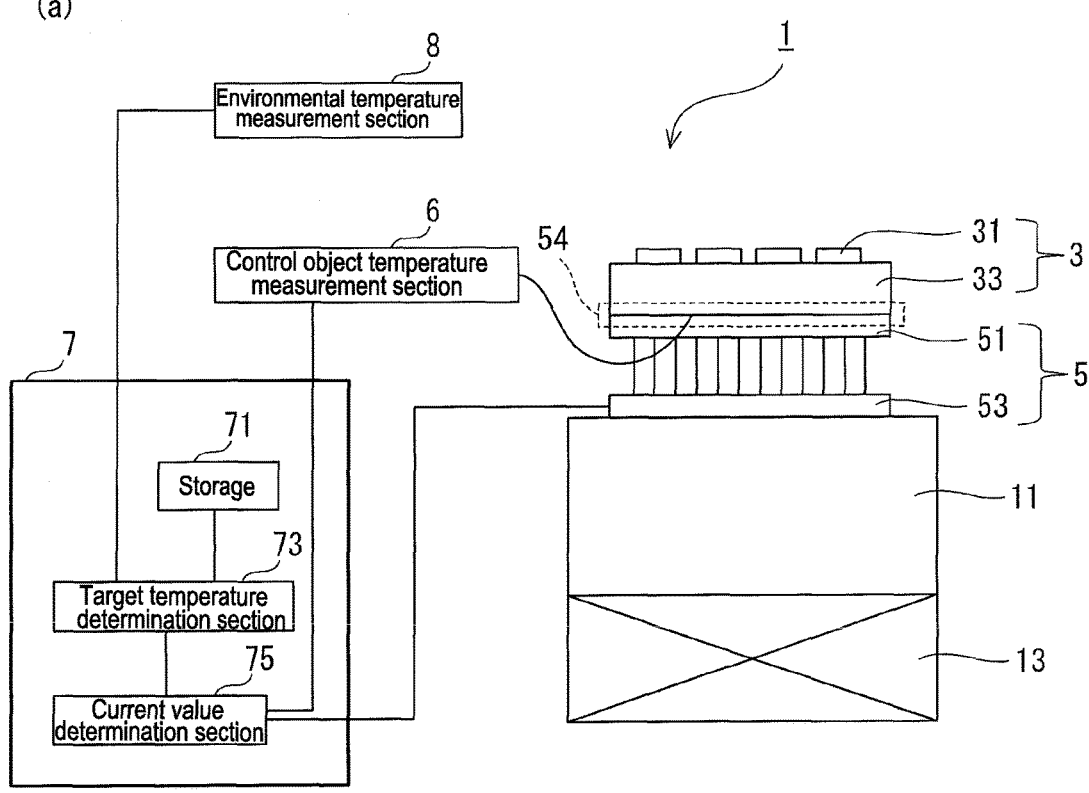
FIG. 1 is a diagram schematically showing a configuration of a laser light source device of an embodiment.

A laser light source device of the present embodiment will be described with reference to the drawings. In each drawing, the dimensional ratio of the drawings does not necessarily coincide with the actual dimensional ratio.

EMBODIMENTS

[Configuration]

Hereinafter, a configuration of a laser light source device 1 according to the embodiment will be described with reference to FIG. 1. As shown in FIG. 1(a), the laser light source device 1 includes a light source unit 3, a Peltier element 5, a control object temperature measurement section 6, an environmental temperature measurement section 8, a controller 7, a heat sink 11, and a fan 13.

The light source unit 3 includes a semiconductor laser element 31 that emits laser light and a heat transfer portion 33. The heat transfer portion 33 has thermal conductivity and is connected to the semiconductor laser element 31. The heat transfer portion 33 conducts heat, generated from the semiconductor laser element 31, to the Peltier element 5. The heat transfer portion 33 is connected to the Peltier element 5 via a well-known heat dissipation sheet or heat dissipation grease (not shown) so that heat can be efficiently conducted to the Peltier element 5. The heat transfer portion 33 is formed of a metal, such as aluminum, for example.

The Peltier element 5 is connected to the heat transfer portion 33. The Peltier element 5 includes a heat absorbing portion 51 that absorbs heat conducted from the semiconductor laser element 31 to the heat transfer portion 33, and a heat dissipating portion 53 that dissipates the heat, absorbed by the heat absorbing portion 51, to the heat sink 11. The heat absorbing portion 51 includes a heat absorbing surface 54 connected to the heat transfer portion 33. The heat dissipating portion 53 is connected to the heat sink 11 via a well-known heat dissipation sheet or heat dissipation grease (not shown) so that heat can be efficiently dissipated to the heat sink 11.

When current flows through the Peltier element 5, the heat absorbing portion 51 absorbs heat from the heat transfer portion 33, and the heat dissipating portion 53 dissipates the heat, absorbed by the heat absorbing portion 51, to the heat sink 11. That is, heat is transferred from the heat absorbing portion 51 to the heat dissipating portion 53. As described above, the Peltier element 5 is an element capable of cooling the light source unit 3 by supply of current. When the voltage applied to the Peltier element 5 is increased, the current supplied to the Peltier element 5 increases, and the amount of heat absorbed by the heat absorbing portion 51 also increases. As a result, the amount of heat transferred from the heat absorbing portion 51 to the heat dissipating portion 53 also increases. The Peltier element 5 corresponds to the "cooler".

The control object temperature measurement section 6 measures the temperature of the heat absorbing surface 54 of the heat absorbing portion 51 of the Peltier element 5. The temperature of the heat absorbing surface 54 varies with the temperature of the semiconductor laser element 31. For example, if the temperature of the semiconductor laser element 31 rises, the temperature of the heat absorbing surface 54 also rises. On the other hand, if the temperature of the semiconductor laser element 31 decreases, the temperature of the heat absorbing surface 54 also decreases. The control object temperature measurement section 6 may measure the temperature of a place different from the heat absorbing surface 54 of the heat absorbing portion 51. That is, the control object temperature measurement section 6 may be configured to measure the heat absorbing portion 51. The control object temperature measurement section 6 is constituted by a well-known temperature sensor such as a thermistor or a thermocouple. The temperature of the heat absorbing surface 54 corresponds to the "control object temperature".

The environmental temperature measurement section 8 measures the environmental temperature of the laser light source device 1. As an example, when the laser light source device 1 is installed in a housing, the environmental temperature measurement section 8 measures the temperature in a space inside the housing. The environmental temperature measurement section 8 is constituted by a well-known temperature sensor such as a thermistor or a thermocouple.

The controller 7 includes a storage 71, a target temperature determination section 73, and a current value determination section 75.

The storage 71 stores the target temperature of the heat absorbing surface 54 for each environmental temperature. The target temperature of the heat absorbing surface 54 is preset to an appropriate value. The storage 71 stores a data table 72 as shown in FIG. 1(b). In the present embodiment, as an example, there will be described a case where when the laser light source device 1 is operated under the environmental temperature in the range of 10° C. to 40° C., the temperature of the semiconductor laser element 31 is required to be not more than 25° C. In the data table 72, the target temperature is associated with each environmental temperature in the range of 10 to 40° C. In the data table 72, the target temperature is set higher as the environmental temperature rises from 10° C. to 13° C. When the environmental temperature is not less than 13° C., the target temperature is set to 24° C. Details of the target temperature will be described later. In the example of the data table 72, 13° C. corresponds to the "specific temperature".

In the data table 72, the target temperature is set at intervals at which the environmental temperature rises by 1° C.; however, the present invention is not limited thereto. For example, when the environmental temperature is 10° C. to 13° C., the target temperature may be set more finely. For example, the target temperature may be set at intervals at which the environmental temperature rises by 0.5° C.

The target temperature determination section 73 acquires the environmental temperature from the environmental temperature measurement section 8 and acquires the target temperature corresponding to the environmental temperature from the storage 71. As an example, the target temperature determination section 73 may identify the environmental temperature closest to the environmental temperature acquired from the environmental temperature measurement section 8, among the environmental temperatures of the data table 72, and may acquire the target temperature corresponding to the specified environmental temperature.

The current value determination section 75 acquires the target temperature from the target temperature determination section 73 and acquires the temperature of the heat absorbing surface 54 from the control object temperature measurement section 6. The current value determination section 75 determines the current value to be supplied to the Peltier element 5 based on the acquired target temperature and the temperature of the heat absorbing surface 54.

Details of the processing by the controller 7 will be described later.

The heat sink 11 includes fins (not shown) and conducts heat, dissipated from the heat dissipating portion 53, to the fins. Warm air around the fin due to the heat conducted to the fin is discharged into the atmosphere by flow of air generated by the fan 13.

[Processing by Controller]

Figure 2:
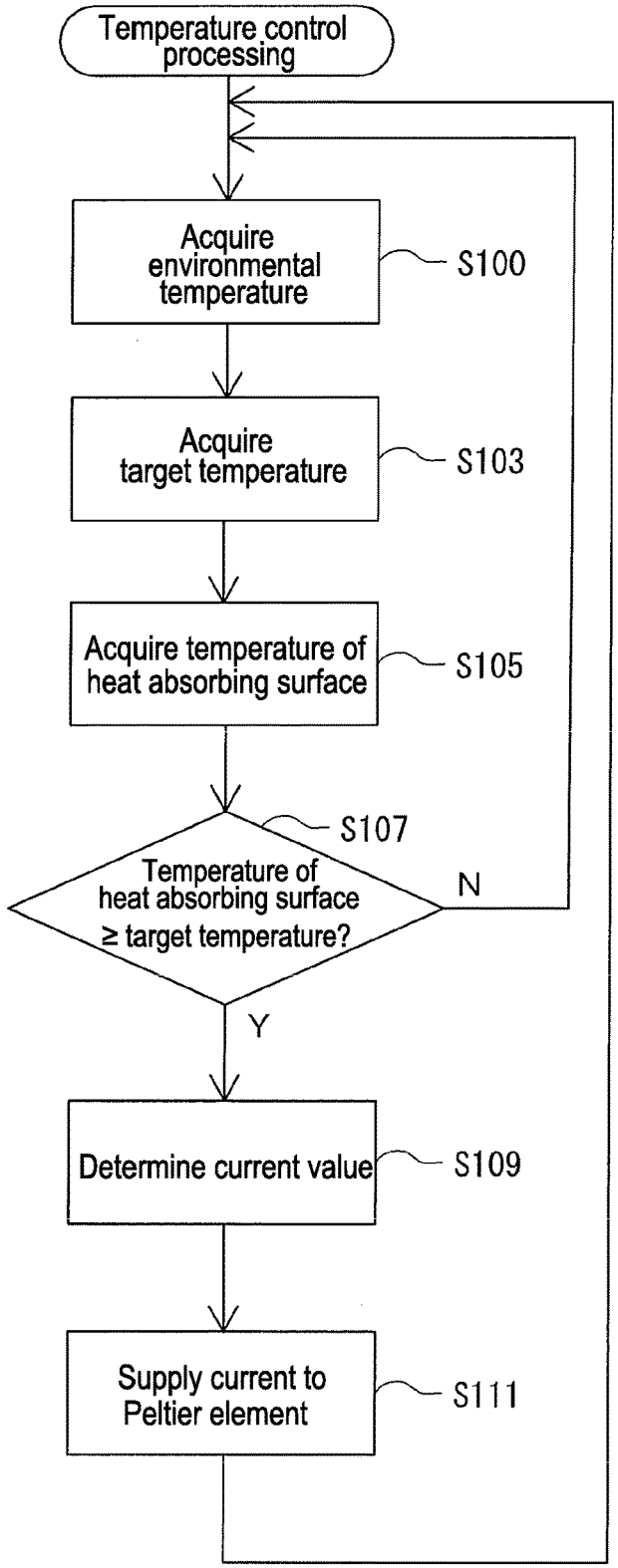
FIG. 2 is a flowchart showing processing of a controller in the laser light source device of the embodiment.

The processing by the controller 7 will be described with reference to FIG. 2. FIG. 2 shows a flowchart of temperature control processing executed by the controller 7.

When an operation instruction for the laser light source device 1 is issued, the controller 7 starts the temperature control processing in FIG. 2. The controller 7 repeats the temperature control processing until a stop instruction for the laser light source device 1 is issued.

When the temperature control processing starts, the target temperature determination section 73 of the controller 7 acquires the environmental temperature from the environmental temperature measurement section 8 (S100). Subsequently, the target temperature determination section 73 of the controller 7 acquires the target temperature, corresponding to the environmental temperature acquired in S100, from the storage 71 (S103). Subsequently, the current value determination section 75 of the controller 7 acquires the temperature of the heat absorbing surface 54 from the control object temperature measurement section 6 (S105). Subsequently, the current value determination section 75 of the controller 7 judges whether the temperature of the heat absorbing surface 54 acquired in S105 is not less than the target temperature acquired in S103 (S107). When the temperature of the heat absorbing surface 54 is not less than the target temperature (S107: YES), the current value determination section 75 of the controller 7 determines the current value to be supplied to the Peltier element 5 such that the temperature of the heat absorbing surface 54 decreases to the target temperature (S109). Specifically, the current value to be supplied to the Peltier element 5 is increased as a difference between the temperature of the heat absorbing surface 54 and the target temperature acquired in S103 is larger. Then, the current value determination section 75 of the controller 7 supplies current having the current value determined in S109 to the Peltier element 5 (S111), and the flowchart returns to the processing of S100. On the other hand, when the temperature of the heat absorbing surface 54 is lower than the target temperature (S107: NO), the flowchart returns to the processing of S100. That is, the current value determination section 75 of the controller 7 does not supply current to the Peltier element 5.

As described above, when the temperature of the heat absorbing surface 54 is not less than the target temperature, the controller 7 causes the Peltier element 5 to execute cooling operation (YES in S107); however, when the temperature of the heat absorbing surface 54 is lower than the target temperature, the controller 7 does not cause the Peltier element 5 to perform the cooling operation (NO in S107).

[Experimental Results and Analysis]

Figure 3:
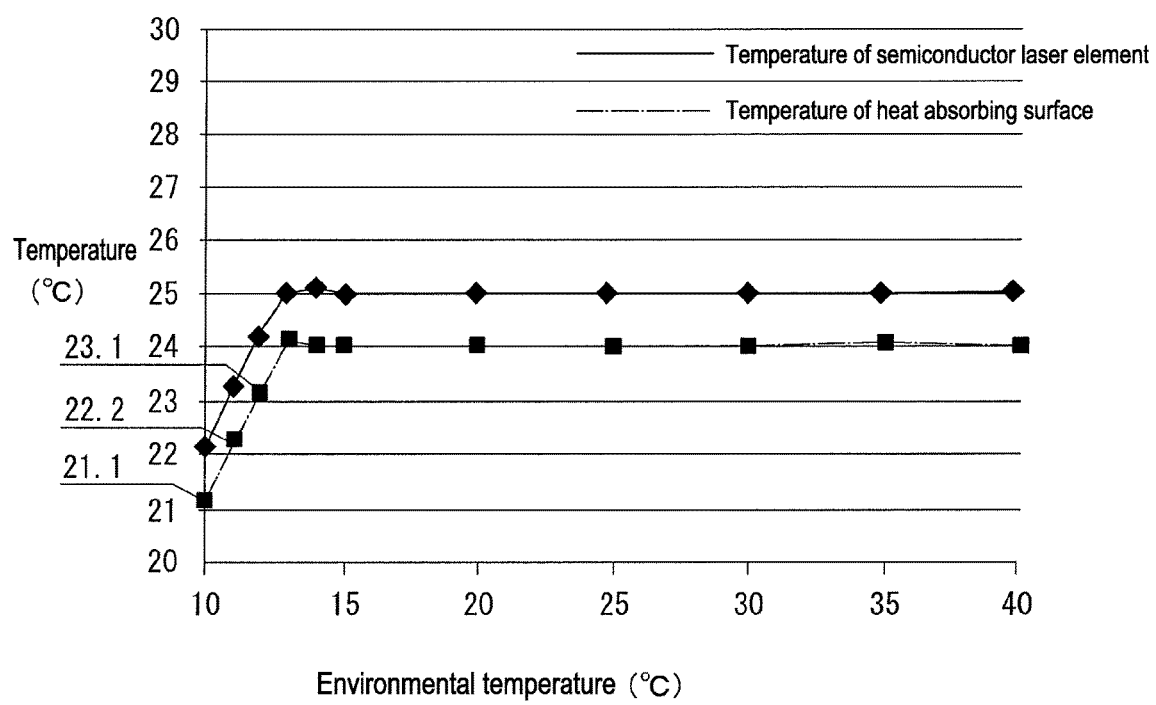
FIG. 3 is a graph showing experimental results in the laser light source device of the embodiment.

The present inventor conducted experiments in which the laser light source device 1 of this embodiment was operated under different environmental temperatures and the temperatures of the semiconductor laser element 31 and the heat absorbing surface 54 were measured. FIG. 3 shows the experimental results. As described above, in this embodiment, as an example, it is assumed that the temperature of the semiconductor laser element 31 is required to be not more than 25° C. when the environmental temperature is 10 to 40° C. Thus, the present inventor conducted the above-described experiments in the case where the environmental temperature is 10 to 40° C.

In FIG. 3, the temperature of the semiconductor laser element 31 is indicated by a solid line, and the temperature of the heat absorbing surface 54 is indicated by a one-dot chain line. As shown in FIG. 3, when the environmental temperature was 10° C., the temperature of the heat absorbing surface 54 was 21.1° C. On the other hand, when the environmental temperature was 11° C., the temperature of the heat absorbing surface 54 was 22.2° C., and when the environmental temperature was 12° C., the temperature of the heat absorbing surface 54 was 23.1° C. When the environmental temperature was not less than 13° C., the temperature of the heat absorbing surface 54 was stabilized around 24.0° C. That is, at any environmental temperature of 10 to 40° C., the temperature of the heat absorbing surface 54 was stabilized around the target temperature set in the data table 72 shown in FIG. 1(*b*). The temperature of the semiconductor laser element 31 was stabilized at not more than 25° C. at any environmental temperature.

As described above, according to the laser light source device 1 of this embodiment, the temperature of the semiconductor laser element 31 was able to be kept at not more than 25° C. when the environmental temperature was 10 to 40° C. This is because, when the laser light source device 1 is operated under each environmental temperature of 10 to 40° C., the Peltier element 5 executes the cooling operation. As an example, a case where the environmental temperature is 12° C. will be described.

When the environmental temperature is 12° C., the target temperature of the heat absorbing surface 54 is set to 23.1° C. as shown in the data table 72 of FIG. 1(*b*). When the laser light source device 1 is operated at an environmental temperature of 12° C., the temperature of the heat absorbing surface 54 reaches 23.1° C. That is, since the temperature of the heat absorbing surface 54 reaches the target temperature, the controller 7 operates the Peltier element 5. More specifically, it is determined as YES in S107 of FIG. 2, and current is supplied to the Peltier element 5 in S111, whereby the Peltier element 5 executes the cooling operation. Likewise for the other environmental temperatures, the temperature of the heat absorbing surface 54 reaches the target temperature set for each environmental temperature, so that the Peltier element 5 executes the cooling operation.

It is assumed that the target temperature of the heat absorbing surface 54 is always set to a fixed temperature (for example, 24° C.) regardless of the environmental temperature. Hereinafter, the laser light source device thus configured is referred to as a laser light source device of a reference example. The present inventor confirmed that the temperature of the semiconductor laser element might exceed a required temperature depending on the environmental temperature in the laser light source device of the reference example. Hereinafter, the laser light source device of the reference example will be described.

Reference Example

[Configuration]

Figure 4:
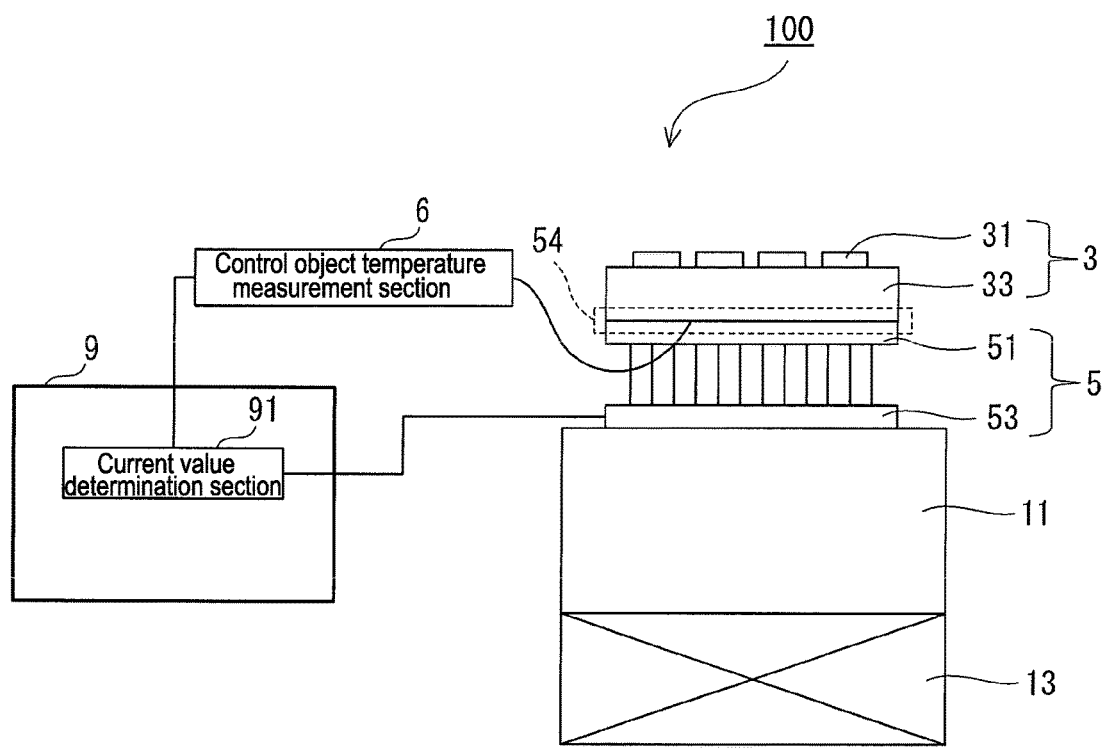
FIG. 4 is a diagram schematically showing a configuration of a laser light source device of a reference example.

FIG. 4 shows a laser light source device 100 of a reference example. The laser light source device 100 of the reference example is different from the laser light source device 1 of the embodiment in that the environmental temperature measurement section 8 is not provided, and a controller 9 is provided in place of the controller 7, and other configurations are similar to the case in the laser light source device 1. Thus, the controller 9 will be described below.

In the laser light source device 100 of the reference example, as in the laser light source device 1 of the embodiment, as an example, it is assumed that when the laser light source device 100 is operated at an environmental temperature of 10° C. to 40° C., the temperature of the semiconductor laser element 31 is required to be stabilized at not more than 25° C. In the laser light source device 100 of the reference example, as an example, the target temperature of the heat absorbing surface 54 is always set to 24° C. regardless of the environmental temperature.

The target temperature of the heat absorbing surface 54 (that is, 24° C.) is determined by finding a target temperature at which the temperature of the semiconductor laser element 31 is stabilized at 25° C. That is, when the laser light source device 100 is operated, the target temperature is appropriately changed. Then, the target temperature at which the temperature of the semiconductor laser element 31 has reached 25° C. is found out. In the case of the laser light source device 100, when the target temperature was set to 24° C., since the temperature of the semiconductor laser element 31 was kept at 25° C., the target temperature was set to 24° C.

The controller 9 includes a current value determination section 91. The current value determination section 91 acquires the temperature of the heat absorbing surface 54 from the control object temperature measurement section 6. The current value determination section 91 determines a current value to be supplied to the Peltier element 5 based on a fixed target temperature (that is, 24° C.) and the acquired temperature of the heat absorbing surface 54.

[Processing by Controller]

Figure 5:
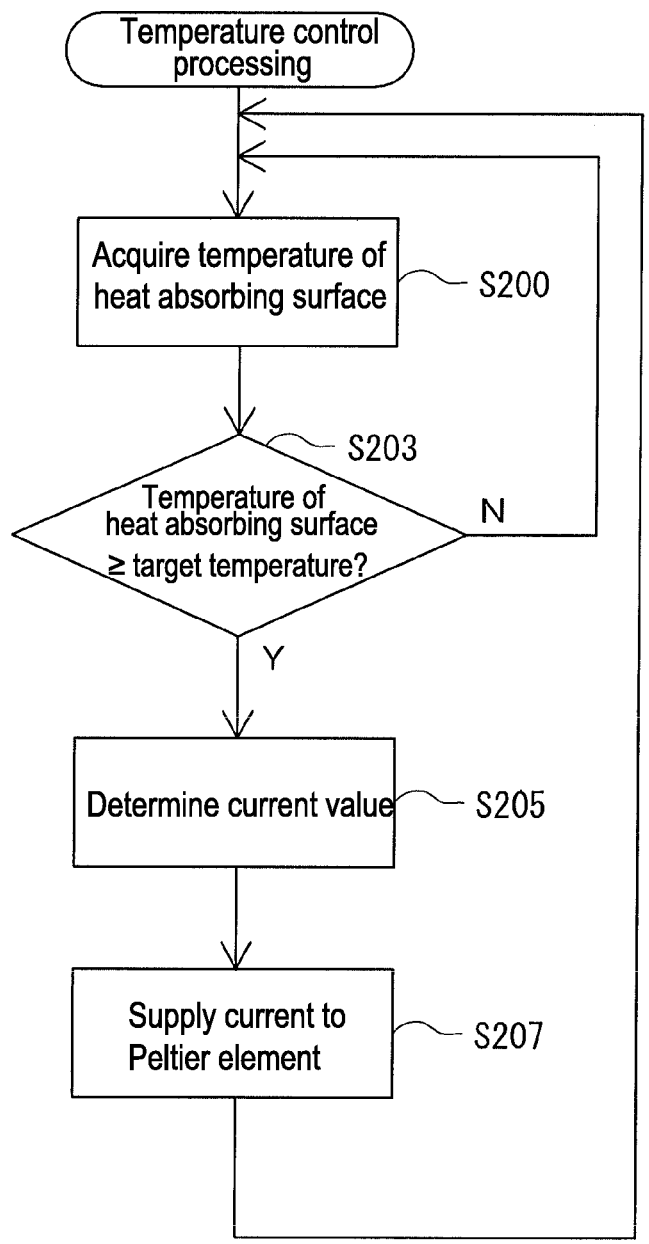
FIG. 5 is a flowchart showing processing of a controller in the laser light source device of the reference example.

The processing by the controller 9 will be described with reference to FIG. 5. FIG. 5 shows a flowchart of temperature control processing executed by the current value determination section 91 of the controller 9.

When an operation instruction for the laser light source device 100 is issued, the current value determination section 91 starts the temperature control processing in FIG. 5. The current value determination section 91 repeats the temperature control processing until a stop instruction for the laser light source device 100 is issued.

When starting the temperature control processing, the current value determination section 91 acquires the measured temperature of the heat absorbing surface 54 from the control object temperature measurement section 6 (S200). Subsequently, the current value determination section 91 judges whether the temperature of the heat absorbing surface 54 acquired in S200 is not less than a fixed target temperature (that is, 24° C.) (S203). When the temperature of the heat absorbing surface 54 is not less than the fixed target temperature (S203: YES), the current value determination section 91 determines the current value to be supplied to the Peltier element 5 (S205). Specifically, the current value to be supplied to the Peltier element 5 is increased as a difference between the temperature of the heat absorbing surface 54 and the fixed target temperature is larger. Subsequently, the current value determination section 91 supplies current having the current value determined in S205 to the Peltier element 5 (S207) and returns to the processing of S200. When the temperature of the heat absorbing surface 54 is lower than the fixed target temperature (S203: NO), the flowchart returns to the processing of S200. That is, the current value determination section 91 does not supply current to the Peltier element 5.

[Experimental Results and Analysis]

Figure 6:
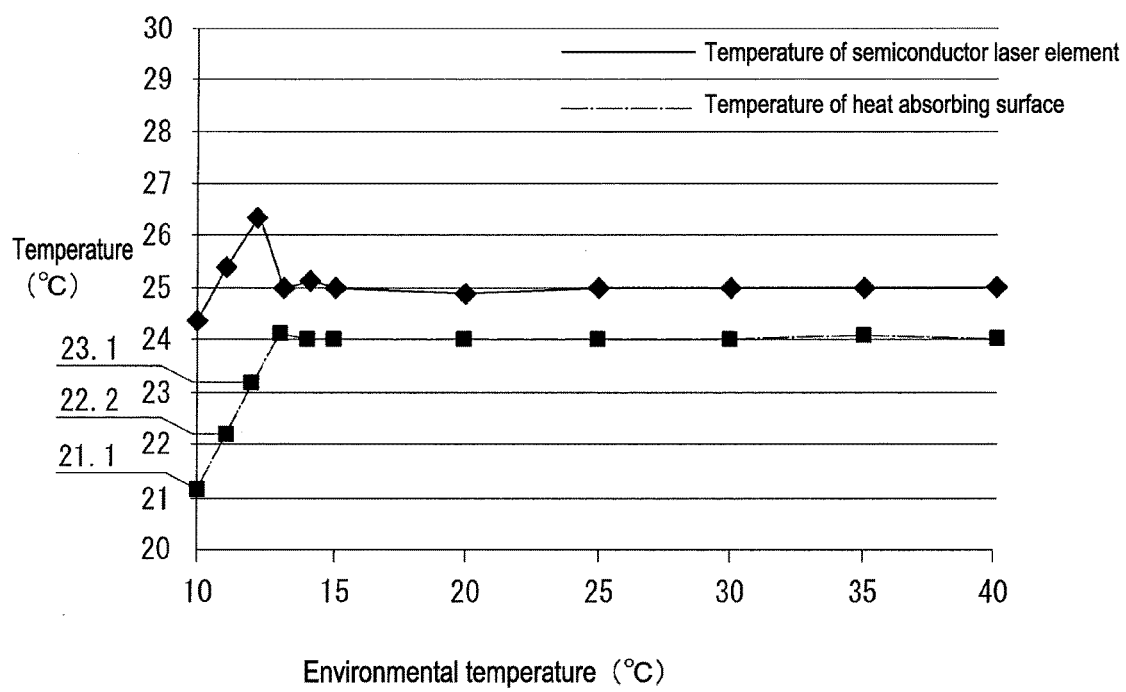
FIG. 6 is a graph showing experimental results in the laser light source device of the reference example.

As described above, the present inventor confirmed that the temperature of the semiconductor laser element 31 might exceed 25° C. depending on the environmental temperature in the laser light source device 100 of the reference example. FIG. 6 shows measurement results of the temperatures of the semiconductor laser element 31 and the heat absorbing surface 54 when the laser light source device 100 of the reference example is operated under different environmental temperatures of 10 to 40° C.

In FIG. 6, the temperature of the semiconductor laser element 31 is indicated by a solid line, and the temperature of the heat absorbing surface 54 is indicated by a one-dot chain line. As shown in FIG. 6, at any environmental temperature of 10° C. to 40° C., the temperature of the heat absorbing surface 54 was stabilized within a range of not more than a fixed target temperature (that is, 24° C.). However, when the temperature of the semiconductor laser element 31 is actually measured, it has been found that although the temperature of the semiconductor laser element 31 is kept at not more than 25° C. as the required temperature when the environmental temperature is 10° C. and 13° C. to 40° C., the temperature of the semiconductor laser element 31 exceeds 25° C. as the required temperature when the environmental temperature is 11° C. or 12° C. The reason why the temperature of the semiconductor laser element 31 exceeds the required temperature as described above will be described by taking as an example the case where the environmental temperature is 11° C.

When the environmental temperature is 11° C., the temperature of the heat absorbing surface 54 reaches 22.2° C. However, in the laser light source device 100 of the reference example, the target temperature of the heat absorbing surface 54 is always set to a fixed temperature, that is, 24° C. Thus, in the temperature control processing in FIG. 5, the current value determination section 91 of the controller 9 judges that the temperature of the heat absorbing surface 54 is not equal to or higher than the target temperature (NO in S203), and does not supply current to the Peltier element 5. That is, when the environmental temperature is 11° C., the temperature of the heat absorbing surface 54 already falls below the target temperature, so that the Peltier element 5 does not perform the cooling operation. Thus, when the environmental temperature is 11° C., as shown in FIG. 6, although the temperature of the heat absorbing surface 54 is kept at not more than the target temperature, the temperature of the semiconductor laser element 31 exceeds 25° C. as the required temperature.

On the other hand, when the environmental temperature is not less than 13° C., the temperature of the heat absorbing surface 54 reaches 24° C. Thus, the temperature of the heat absorbing surface 54 is not less than the target temperature, and the Peltier element 5 executes the cooling operation. As a result, the temperature of the semiconductor laser element 31 is stabilized around 25° C. as the required temperature. As described above, 13° C. corresponds to the "specific temperature". The "specific temperature" is a minimum environmental temperature among the environmental temperatures at which the temperature of the heat absorbing surface 54 reaches a fixed target temperature (that is, 24° C.), as shown in FIG. 6.

(Setting of Target Temperature in Embodiment)

Subsequently, in the laser light source device 1 of this embodiment, the target temperature set according to the environmental temperature will be specifically described. Hereinafter, as an example, there will be described a case where the required temperature for the semiconductor laser element 31 is 25° C. and the environmental temperature varies within the range of 10 to 40° C.

According to the laser light source device 100 of the reference example, as shown in FIG. 6, when the environmental temperature is as relatively high as 13° C. or higher, the temperature of the semiconductor laser element 31 is kept around 25° C. That is, if the environmental temperature is not less than 13° C., the temperature of the semiconductor laser element 31 is not more than the required temperature (that is, not more than 25° C.) even when the target temperature is set to a fixed temperature (that is, 24° C.). Accordingly, in the laser light source device 1 of this embodiment, when the environmental temperature is not less than 13° C., the same target temperature (that is, 24° C.) as the laser light source device 100 of the reference example is set (see the data table 72 of FIG. 1(b)).

On the other hand, according to the laser light source device 100 of the reference example, as shown in FIG. 6, when the target temperature is set to a fixed temperature (that is, 24° C.) in a case where the environmental temperature is as relatively low as 11° C. or 12° C., the temperature of the heat absorbing surface 54 falls below the target temperature. Thus, the Peltier element 5 does not execute the cooling operation, and the temperature of the semiconductor laser element 31 exceeds 25° C. as the required temperature.

Accordingly, in the laser light source device 1 of this embodiment, when the environmental temperature is as relatively low as 11° C. or 12° C., it is necessary to set the target temperature to lower than 24° C. so that the Peltier element 5 can execute the cooling operation. More specifically, it is necessary to set the target temperature to not more than the temperature of the heat absorbing surface 54. This is because if the target temperature is not more than the temperature of the heat absorbing surface 54, the temperature of the heat absorbing surface 54 is not less than the target temperature, and the Peltier element 5 can execute the cooling operation (YES in S107 of FIG. 2).

As shown in FIG. 6, when the environmental temperature is 11° C., the temperature of the heat absorbing surface 54 is 22.2° C., and when the environmental temperature is 12° C., the temperature of the heat absorbing surface 54 is 23.1° C. Accordingly, when the environmental temperature is 11° C., the target temperature is set to not more than 22.2° C., and when the environmental temperature is 12° C., the target temperature is set to not more than 23.1° C., so that the temperature of the heat absorbing surface 54 is not less than the target temperature, and as a result, the Peltier element 5 can execute the cooling operation.

In the laser light source device 1 of this embodiment, when the environmental temperature was 11° C. or 12° C., the target temperature was set to the temperature of the heat absorbing surface 54. That is, when the environmental temperature was 11° C., the target temperature was set to 22.2° C., and when the environmental temperature was 12° C., the target temperature was set to 23.1° C. (see the data table 72 of FIG. 1(b)). As described above, when the environmental temperature is 11° C. or 12° C., the target temperature may be set to not more than the temperature of the heat absorbing surface 54.

(Operation and Effect According to Embodiment)

As described above, according to the laser light source device 1 of this embodiment, the target temperature is previously adjusted so as to be not more than the temperature of the heat absorbing surface 54. Thus, the Peltier element 5 can execute the cooling operation even when the environmental temperature is relatively low, so that it is possible to prevent the temperature of the semiconductor laser element 31 from exceeding 25° C., and to suppress shortening of the lifetime of the semiconductor laser element 31.

Here, since the Peltier element 5 is always caused to execute the cooling operation even when the environmental temperature changes, it seems possible to keep the target temperature as low as possible (for example, 22° C.). However, if the target temperature is thus kept as low as possible, the temperature of the semiconductor laser element 31 is stabilized at a temperature lower than the required temperature. As a result, it becomes necessary to increase the driving force of the Peltier element 5, so that the power consumption of the Peltier element 5 increases. On the other hand, according to the laser light source device 1 of this embodiment, when the environmental temperature is, for example, 11° C. or 12° C., the target temperature is set to a maximum temperature at which the Peltier element 5 can execute the cooling operation. Thus, an increase in the power consumption of the Peltier element 5 can be suppressed.

In general, the Peltier element can switch between cooling operation and heating operation by changing a polarity of current to be supplied. Thus, in the laser light source device 100 of the reference example, when the temperature of the heat absorbing surface 54 falls below a fixed target temperature (that is, 24° C.), it seems that the temperature of the heat absorbing surface 54 can be increased to the target temperature by causing the Peltier element 5 to execute the heating operation. However, in the laser light source device 100 of the reference example and the laser light source device 1 of this embodiment, the Peltier element 5 can execute the cooling operation but cannot execute the heating operation. When the drive circuit of the Peltier element 5 is designed such that the polarity of the current can be changed, the drive circuit has a complicated configuration. This is because the laser light source device 100 of the reference example and the laser light source device 1 of this embodiment are designed such that the current flowing through the Peltier element 5 is in one direction. As described above, according to the laser light source device 1 of this embodiment, it is possible to prevent the temperature of the semiconductor laser element 31 from exceeding the required temperature without complicating the drive circuit of the Peltier element 5.

Further, according to the laser light source device 1 of this embodiment, the temperature of the heat absorbing surface 54 of the Peltier element 5 is measured, and the temperature of the heat absorbing surface 54 is to be controlled. As described in the section of the problems to be solved by the invention, the heat transfer section 33 exists in a heat transfer path from the semiconductor laser element 31 to the Peltier element 5. Due to the influence of the heat transfer section 33, there has occurred such an event that the temperature of the semiconductor laser element 31 exceeds a fixed required temperature. On the other hand, the controller 7 is to control not the temperature of the semiconductor laser element 31 but the temperature of the heat absorbing surface 54. That is, the controller 7 is to control a temperature of a place closer to the Peltier element 5 than the semiconductor laser element 31. Consequently, the influence of the heat transfer section 33 can be suppressed. That is, an influence of a difference between the temperature of the semiconductor laser element 31 and the temperature of the Peltier element 5 can be suppressed. Consequently, the controller 7 can perform highly accurate temperature control as compared with the case of measuring the temperature of the semiconductor laser element 31, so that it is possible to prevent the temperature of the semiconductor laser element 31 from exceeding the required temperature.

In particular, the controller 7 is to control the temperature of the heat absorbing portion 51 of the Peltier element 5. As described above, as the current value of the current flowing through the Peltier element 5 increases, the amount of heat absorbed by the heat absorbing portion 51 also increases. Thus, the controller 7 can control the current value to be supplied to the Peltier element 5 according to the temperature of the heat absorbing portion 51.

Another Embodiment

It should be noted that the laser light source device is not limited to the configuration of the above-described embodiment, and, of course, can be modified in various ways without departing from the spirit of the present invention. For example, it is, of course, possible to arbitrarily select configurations according to the following another embodiment and employ them in the configuration according to the above-described embodiments.

Figure 7:
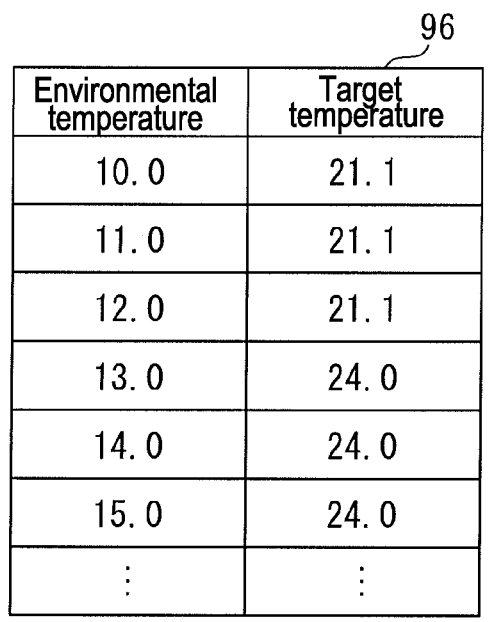
FIG. 7 is a diagram for explaining a target temperature in another embodiment.

<1> In this embodiment, as shown in the data table 72 of FIG. 1(b), when the environmental temperature is 10 to 13° C., the target temperature is set higher as the environmental temperature rises; however, the present invention is not limited thereto. For example, as in data table 96 shown in FIG. 7, when the environmental temperature is less than 13° C., the target temperature may be set to a target temperature (that is, 21.1° C.) in the case where the environmental temperature is 10° C. As described above, this embodiment has an advantage that the power consumption of the Peltier element 5 can be reduced as compared with this another embodiment.

<2> In this embodiment, as shown in the data table 72 of FIG. 1(b), when the environmental temperature is not less than 13° C., a fixed target temperature is set; however, the present invention is not limited thereto. For example, a different target temperature may be set for each environmental temperature. In this case, the target temperature may be set to be closer to 24° C. as the environmental temperature becomes higher. According to the laser light source device 1 of this embodiment, the temperature of the semiconductor laser element 31 can be kept at a fixed temperature, that is, 25° C. when the environmental temperature is, for example, 13 to 40° C. Thus, there is an advantage that characteristics such as light output of the laser light emitted from the semiconductor laser element 31 can be made constant.

<3> In this embodiment, as shown in FIG. 1(a), the control object temperature measurement section 6 measures the temperature of the heat absorbing surface 54 of the heat absorbing portion 51 of the Peltier element 5; however, the control object temperature measurement section 6 may measure the temperature of the heat transfer portion 33 or may measure temperature of a metal plate provided between the light source unit 3 and the Peltier element 5. In this case, the metal plate corresponds to the "heat transfer portion". More generally, the control object temperature measurement section 6 may measure the temperature at a place closer to the heat absorbing portion 51 than the semiconductor laser element 31, that is, the temperature varying with the temperature of the semiconductor laser element 31.

DESCRIPTION OF REFERENCE SIGNS

1: Laser light source device
3: Light source unit
31: Semiconductor laser element
33: Heat transfer portion
5: Peltier element
51: Heat absorbing portion
53: Heat dissipating portion
54: Heat absorbing surface
6: Control object temperature measurement section
7: Controller
71: Storage
72: Data table
73: Target temperature determination section
75: Current value determination section
8: Environmental temperature measurement section
9: Controller of reference example
91: Current value determination section of reference example
96: Data table of another embodiment

The invention claimed is:

1. A laser light source device comprising:
a semiconductor laser element;
a heat transfer portion having thermal conductivity and connected to the semiconductor laser element;
a cooler connected to the heat transfer portion on a side different from the semiconductor laser element;
a control object temperature measurement section that measures a control object temperature as the temperature of the heat transfer portion or the cooler;
an environmental temperature measurement section that measures an environmental temperature of the laser light source device; and
a controller that controls the cooler,
wherein
the controller is configured to control the cooler such that the control object temperature approaches a predetermined target temperature set according to the environmental temperature, and
the target temperature set when the environmental temperature is lower than a specific temperature is lower than the target temperature set when the environmental temperature is higher than the specific temperature.

2. The laser light source device according to claim 1, wherein
the control object temperature in a case where the environmental temperature is lower than the specific temperature and the cooler that does not operate is measured in advance, and
when the environmental temperature is lower than the specific temperature, the target temperature is set to not more than the control object temperature measured in advance.

3. The laser light source device according to claim 1, wherein
the cooler is a Peltier element having a heat absorbing portion that absorbs heat from the heat transfer portion, and the control object temperature measurement section measures the temperature in the heat absorbing portion of the Peltier element.

4. The laser light source device according to claim 1, wherein
when the environmental temperature is lower than the specific temperature, the target temperature is set higher as the environmental temperature approaches the specific temperature.

5. The laser light source device according to claim 1, wherein
when the environmental temperature is not less than the specific temperature, the target temperature is set to a fixed temperature.

6. The laser light source device according to claim 1, wherein
the controller comprises
a storage that stores the target temperature corresponding to each of the environmental temperatures,
a target temperature determination section that determines the target temperature, corresponding to the environmental temperature measured by the environmental temperature measurement section, from among the target temperatures stored in the storage, and
a current value determination section that determines a current value to be supplied to the cooler based on a difference between the determined target temperature and the control object temperature measured by the control object temperature measurement section.

7. The laser light source device according to claim 2, wherein
the cooler is a Peltier element having a heat absorbing portion that absorbs heat from the heat transfer portion, and
the control object temperature measurement section measures the temperature in the heat absorbing portion of the Peltier element.

8. The laser light source device according to claim 2, wherein
when the environmental temperature is lower than the specific temperature, the target temperature is set higher as the environmental temperature approaches the specific temperature.

9. The laser light source device according to claim 3, wherein
when the environmental temperature is lower than the specific temperature, the target temperature is set higher as the environmental temperature approaches the specific temperature.

10. The laser light source device according to claim 7, wherein
when the environmental temperature is lower than the specific temperature, the target temperature is set higher as the environmental temperature approaches the specific temperature.

11. The laser light source device according to claim 2, wherein
when the environmental temperature is not less than the specific temperature, the target temperature is set to a fixed temperature.

12. The laser light source device according to claim 3, wherein
when the environmental temperature is not less than the specific temperature, the target temperature is set to a fixed temperature.

13. The laser light source device according to claim 4, wherein
when the environmental temperature is not less than the specific temperature, the target temperature is set to a fixed temperature.

14. The laser light source device according to claim 2, wherein
the controller comprises
a storage that stores the target temperature corresponding to each of the environmental temperatures,
a target temperature determination section that determines the target temperature, corresponding to the environmental temperature measured by the environmental temperature measurement section, from among the target temperatures stored in the storage, and
a current value determination section that determines a current value to be supplied to the cooler based on a difference between the determined target temperature and the control object temperature measured by the control object temperature measurement section.

15. The laser light source device according to claim 3, wherein
the controller comprises
a storage that stores the target temperature corresponding to each of the environmental temperatures,
a target temperature determination section that determines the target temperature, corresponding to the environmental temperature measured by the environmental temperature measurement section, from among the target temperatures stored in the storage, and
a current value determination section that determines a current value to be supplied to the cooler based on a difference between the determined target temperature and the control object temperature measured by the control object temperature measurement section.

16. The laser light source device according to claim 4, wherein
the controller comprises
a storage that stores the target temperature corresponding to each of the environmental temperatures,
a target temperature determination section that determines the target temperature, corresponding to the environmental temperature measured by the environmental temperature measurement section, from among the target temperatures stored in the storage, and
a current value determination section that determines a current value to be supplied to the cooler based on a difference between the determined target temperature and the control object temperature measured by the control object temperature measurement section.

17. The laser light source device according to claim 5, wherein
the controller comprises
a storage that stores the target temperature corresponding to each of the environmental temperatures,
a target temperature determination section that determines the target temperature, corresponding to the environmental temperature measured by the environmental temperature measurement section, from among the target temperatures stored in the storage, and
a current value determination section that determines a current value to be supplied to the cooler based on a difference between the determined target temperature and the control object temperature measured by the control object temperature measurement section.

* * * * *